(12) United States Patent
Chuang et al.

(10) Patent No.: US 8,039,279 B2
(45) Date of Patent: Oct. 18, 2011

(54) METHOD FOR MAKING A LIGHT EMITTING DIODE BY ELECTROLESS PLATING

(75) Inventors: Chia-Ming Chuang, Hsinchu (TW); Yu-Heng Shao, Hsinchu (TW); Liang-Sheng Chi, Hsieh (TW); Yu-Chieh Huang, Hsinchu (TW); Tai-Chan Huo, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 321 days.

(21) Appl. No.: 11/890,493

(22) Filed: Aug. 7, 2007

(65) Prior Publication Data
US 2008/0032434 A1 Feb. 7, 2008

(51) Int. Cl.
*H01L 21/00* (2006.01)
(52) U.S. Cl. .......................... 438/28; 438/34
(58) Field of Classification Search .............. 438/28, 438/34
See application file for complete search history.

(56) References Cited

U.S. PATENT DOCUMENTS

| | | | |
|---|---|---|---|
| 6,607,650 B1 | 8/2003 | Niuya et al. | |
| 2004/0096592 A1* | 5/2004 | Chebiam et al. | 427/443.1 |
| 2005/0142685 A1* | 6/2005 | Ouellet et al. | 438/51 |
| 2005/0264888 A1* | 12/2005 | An et al. | 359/572 |
| 2005/0280352 A1 | 12/2005 | Lai | |
| 2006/0202219 A1* | 9/2006 | Ohashi et al. | 257/98 |
| 2006/0211234 A1* | 9/2006 | Eldridge et al. | 438/617 |
| 2006/0278979 A1* | 12/2006 | Rangel | 257/734 |
| 2007/0080352 A1* | 4/2007 | Wu et al. | 257/79 |
| 2007/0108459 A1* | 5/2007 | Lu | 257/98 |
| 2007/0116864 A1 | 5/2007 | Chen | |
| 2008/0001537 A1* | 1/2008 | Chen et al. | 313/506 |

FOREIGN PATENT DOCUMENTS
TW 200801232 1/2006

* cited by examiner

*Primary Examiner* — N Drew Richards
*Assistant Examiner* — Jae Lee
(74) *Attorney, Agent, or Firm* — Bacon & Thomas PLLC

(57) ABSTRACT

One embodiment of the invention relates to a method of manufacturing a light emitting diode. The method includes forming an insulating layer on an area, not covered by a seed layer, of at least one of a p-type semiconductor layer and an n-type semiconductor layer, wherein the impurity concentration varies on the surface of the area; and immersing at least part of the seed layer into an electrolyte having metal ions which tend to reduce and deposit on the seed layer under no bias voltage.

15 Claims, 11 Drawing Sheets

METHOD FOR MAKING A LIGHT EMITTING DIODE BY ELECTROLESS PLATING

TECHNICAL FIELD

The invention relates to a method of making a light-emitting diode and more particularly to a method of making a bond pad of a light-emitting diode by electroless plating.

REFERENCE TO RELATED APPLICATION

This application claims the right of priority based on TW application Ser. No. 095128980, filed Aug. 7, 2006, entitled "A method for making a light-emitting diode by electroless plating" and the contents of which are hereby incorporated by reference.

DESCRIPTION OF BACKGROUND ART

In a known method of making a light-emitting diode, several epitaxial layers, on which a bond pad is formed, are formed on a growth substrate. The epitaxial layers include an n-type semiconductor layer, a p-type semiconductor layer, and an active layer between the n-type semiconductor layer and the p-type semiconductor layer. The electrons and the holes recombine to emit light provided the active layer is under a bias voltage. The active layer can be classified into categories including as single heterostructure (SH), double heterostructure (DH), double-side double heterostructure (DDH), and multi-quantum well (MQW) etc. The epitaxial layers are formed by chemical vapor deposition (CVD) or physical vapor deposition (PVD).

The bond pads usually electrically connect to the n-type and p-type semiconductor layers by wire-bonding or flip-chip. Therefore, metal is chosen to be the material of the bond pad in principle because it can bear the impact of wire-bonding when the thickness is sufficient. In general, the bond pads are formed on a wafer settled on a spinner by metal deposition. Owing to the omni-directional characteristic of deposition, the material tends to cover the area not designated for the bond pad, and then needs to be removed. From the top view of a chip, the bond pad occupies only 10%~20% of the chip area. In other words, the material covering 80%~90% of the chip area, the spinner, and the chamber of the equipment is redundant and needs to be removed. Even we recycle the redundant material, only 50%~70% of it can be recycled.

SUMMARY OF THE DISCLOSURE

An embodiment of the invention discloses a method of manufacturing a light-emitting diode comprising: providing a substrate; forming a semiconductor multilayer on the substrate, the semiconductor multilayer comprising a p-type semiconductor layer, an n-type semiconductor layer, and a light-emitting region between the p-type semiconductor layer and the n-type semiconductor layer; forming a pre-covering layer on at least one of the p-type semiconductor layer and the n-type semiconductor layer; forming an insulating layer on an area not covered by the pre-covering layer, wherein a surface impurity concentration of the p-type semiconductor layer and the n-type semiconductor layer distributes unevenly on the area; and immersing at least part of the pre-covering layer into an electrolyte having metal ions which tend to reduce and deposit on the pre-covering layer under no bias voltage.

DETAILED DESCRIPTION OF PREFERRED EMBODIMENTS

The invention relates to a method of making a bond pad of a light-emitting diode by electroless plating. The electroless plating is carried out without external voltage applied. In the presence of the chemical reaction between the metal ions of the electrolyte and the deposited article, the metal ions are reduced into solid metal and deposited on the surface of the deposited article. The reduction of the metal ions occurs only on the deposited article, therefore, almost the consumed electrolyte is used to form metal layer in the specific area. In comparison with the conventional vapor deposition or sputtering, the present method reduces about ⅔ amount of plating metal.

Figure 1:
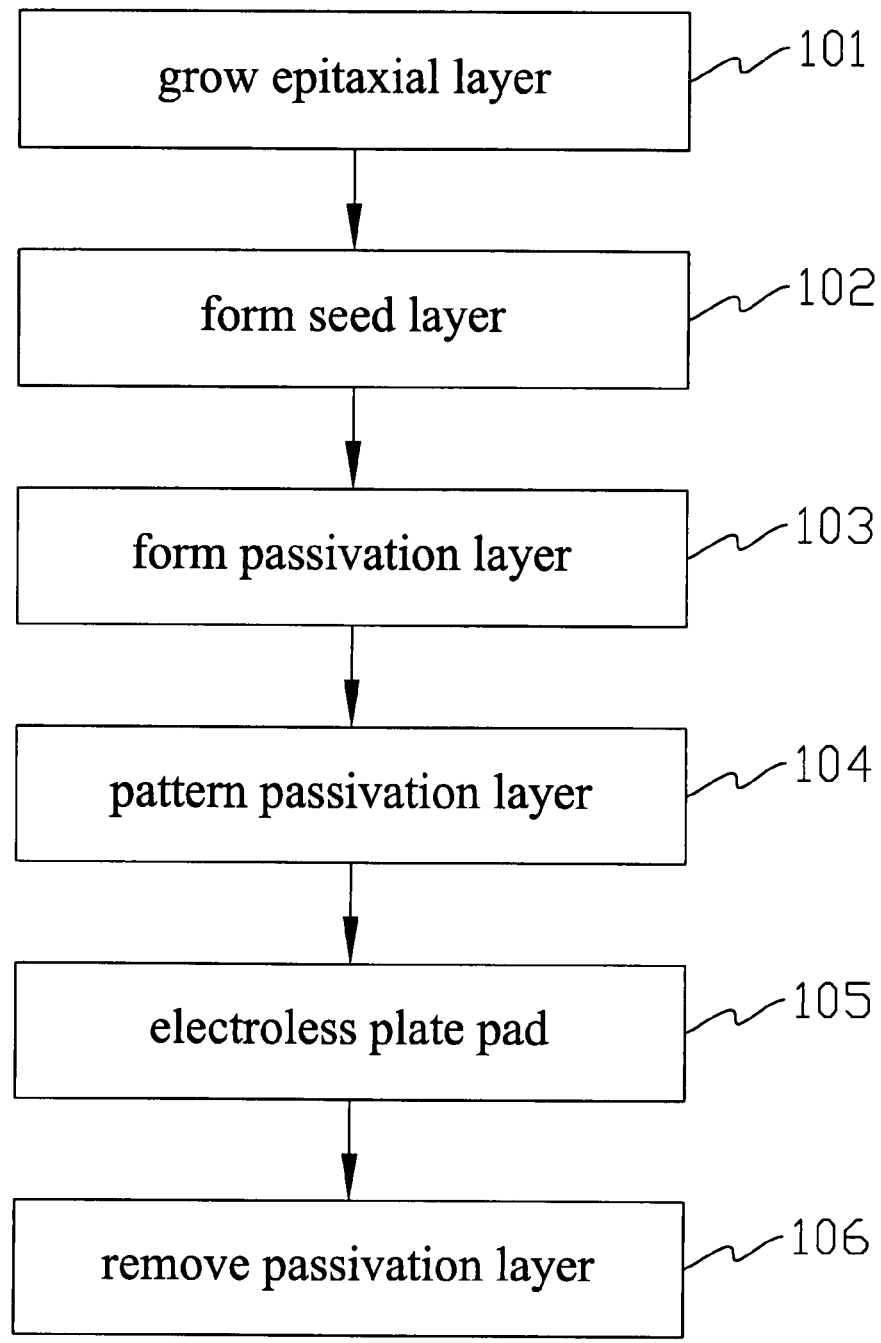
FIG. 1 illustrates a flow chart of the manufacture of the semiconductor light-emitting device according to the present invention.

FIG. 1 illustrates a flow chart of forming a bond pad by electroless plating. First, in step 101, an epitaxial layer structure of a light-emitting diode is formed. The epitaxial layer structure includes a substrate, an n-type semiconductor layer, a p-type semiconductor layer, and a light-emitting region between the n-type semiconductor layer and the p-type semiconductor layer. The electrons from the n-type semiconductor layer and the holes from the p-type semiconductor recombine to emit photons in the light-emitting region provided a bias voltage is applied to the n-type and the p-type semiconductor layers.

In step 102, a metal layer or a conductive layer is then formed on the light-emitting epitaxial layer structure to serve as a seed layer on which the metal ions of the electrolyte are reduced to deposit.

In step 103, a passivation layer or an insulating layer is formed on surfaces of the light-emitting epitaxial layer structure not covered by the seed layer. The metal ions of the electrolyte are not easily reduced on the area not covered by the seed layer. Even though, the ions still have chance to be deposited on a rougher surface like a trench between the chips. Furthermore, the electrons and the holes of the p-type semiconductor layer and the n-type semiconductor layer tend to repel and/or attract the positive metal ions, which results in affecting the deposition rate of the metal ions suspending above the p-type and the n-type semiconductor layers, and accordingly, the deposited metal thickness of the p-bond pad differs from that of the n-bond pad.

In step 104, a bond pad pattern is formed on the passivation layer or the insulating layer by photolithography, which is known to the person skilled in the art and not explained in further detail.

In step 105, at least a part of aforementioned seed layer or a part of the structure expecting to form a plating layer is immersed into an electrolyte to proceed the electroless plating, so that the metal ions reduce to metal and deposit on the seed layer.

In step 106, the passivation layer or the insulating layer is removed by a method including but not limited to wet etching and dry etching.

The First Embodiment

The method of present invention is illustrated by manufacturing a vertical type light-emitting diode. The so-called "vertical type light-emitting diode" herein means a structure having a p-bond pad and an n-bond pad respectively located on the opposite sides of a substrate. The composition of the light-emitting diode includes but not limited to II-VI group compound, III-V group compound, group III-Nitride compound, and the combination thereof. The technology to form the vertical type light-emitting diode by the aforementioned composition is known to the person skilled in the art and not explained in further detail.

Figure 2A:
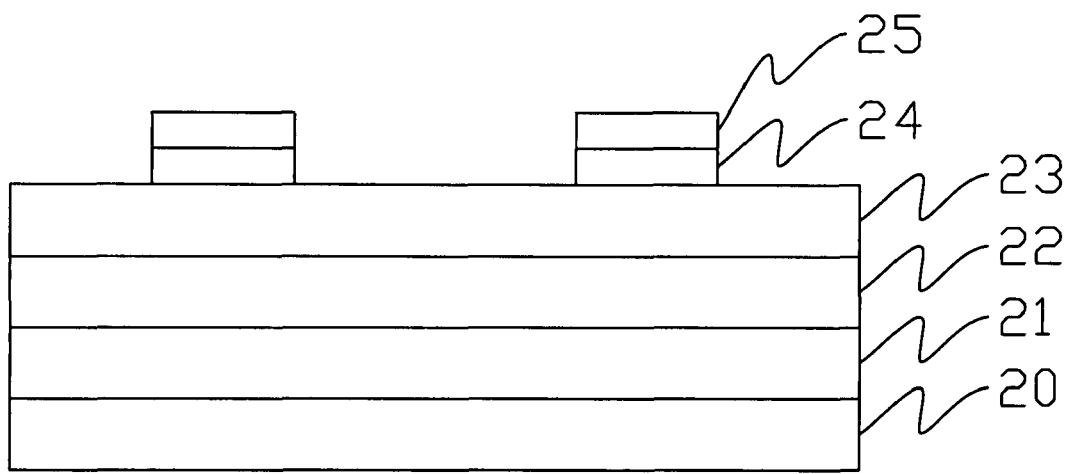
FIGS. 2A~2D illustrate cross sections of the manufacture of the semiconductor light-emitting device according to an embodiment of the present invention.

FIG. 2A illustrates a cross section of an epitaxial structure of a vertical type light-emitting diode. The structure is completed before the formation of the bond pad, and includes at least a substrate 20, an n-type semiconductor layer 21, a light-emitting layer 22, and a p-type semiconductor layer 23. A pre-covering layer 25 is formed on the p-type semiconductor layer 23 to serve as a seed layer. A conductive layer 24 is optionally formed between the p-type semiconductor layer 23 and the pre-covering layer 25. In addition, a transparent conductive layer (not shown) is optionally formed between the conductive layer 24 and the p-type semiconductor layer 23 to serve as a current spreading layer or a window layer.

The material of the substrate 20 herein includes but not limited to AlGaInP, AlGaAs, GaAs, SiC, and Si. The material of the conductive layer 24 includes but not limited to Cr, Pt, Ni, Ge, and any material capable to form a preferable ohmic contact with the semiconductor layer. The thickness of layer 24 is about 100 Å~1000 Å. The material of the pre-covering layer 25 includes but not limited to Au, Cu, Ni, and any material capable to serve as a seed layer in an electroless plating process. The thickness of layer 25 is about 100 Å~5000 Å. The material of the transparent conductive layer includes but not limited to ITO, CTO, IZO, AZO, ZnO, and a transparent conductive metal layer such as Ni/Au. Each of the conductive layer 24, the pre-covering layer 25, and the transparent conductive layer is formed by one of chemical vapor deposition, physical vapor deposition, and sputtering.

Figure 2B:
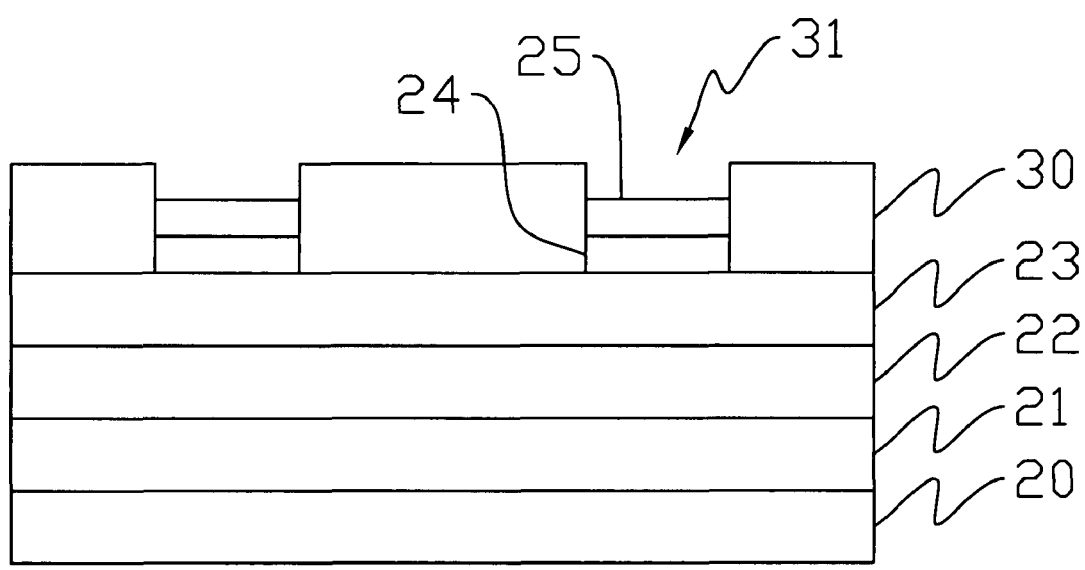

Referring to FIG. 2B, an insulating layer 30 is formed on the p-type semiconductor layer 23 to isolate the p-type semiconductor layer 23 from the electrolyte. An opening 31 is then formed on the insulating layer 30 to expose the pre-covering layer 25 by the known photolithography. The material of the insulating layer 30 includes but not limited to photoresist, $SiO_2$, $SiN_x$, and dry film. The thickness of layer 30 is about 100 Å~17 µm.

The available product of the photoresist can be PR800 of Dery Resources Taiwan INC., NR9-3000P of Wellspring & Vim Tech Corp., or NLOF2035 of AZ Electronic Materials Taiwan Co., Ltd. When $SiO_2$ is adopted as the insulating layer 30, DNRL300 of Dinson Technology Inc. can be the option of the photoresist.

Figure 2C:
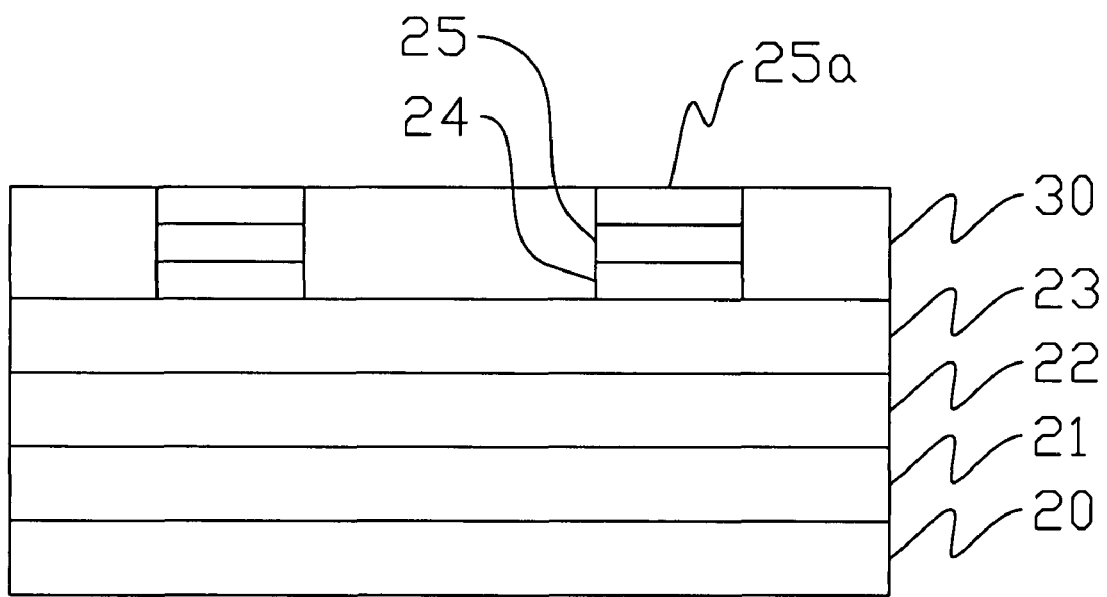

FIG. 2C illustrates the formation of the plating layer 25a on the pre-covering layer 25 by electroless plating. The desired plating layer 25a determines the type of the electrolyte. If the plating layer 25a is Au, the electrolyte is composed of gold sodium sulfide, and the available product can be Gobright®TMX-22 of Taiwan Uyemurac Co. If the plating layer 25a is Cu, the electrolyte is composed of copper sulfate. If the plating layer 25a is Ni, the electrolyte is composed of nickel sulfate.

Figure 2D:
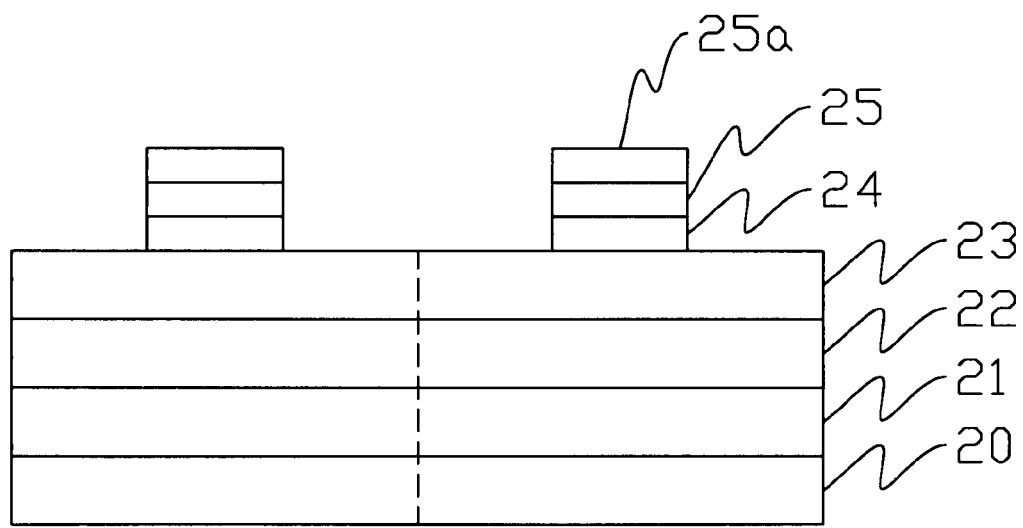

Referring to FIG. 2D, after forming the plating layer 25a, the insulating layer 30 is removed, and an n-electrode bond pad is formed beneath the substrate 20. Finally, the epitaxial structure is diced into chips.

Figure 3:
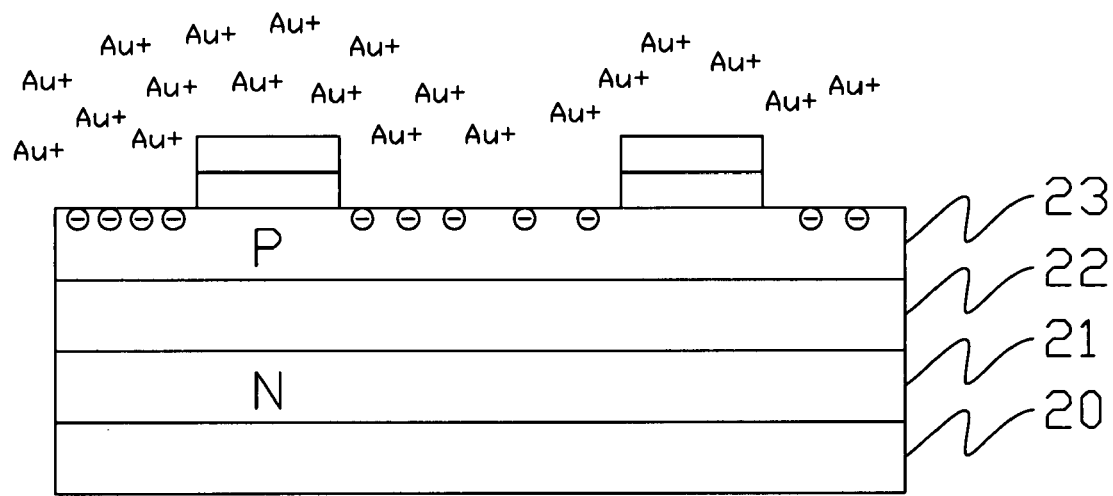
FIG. 3 illustrates Au ion distribution influenced by the semiconductor light-emitting device of FIG. 2A immersed in the electrolyte.

Referring to FIG. 3, the p-type semiconductor layer 23 is doped with a certain type of impurities to generate the majority of acceptors. On the other hand, the n-type semiconductor layer 21 is doped with a certain type of impurities to generate the majority of donors. Because the electrons as the donors and the holes as the acceptors attract each other to keep the electrical equilibrium, the electrons tend to concentrate on the surface of the p-type semiconductor layer far from the light-emitting region. However, the impurity concentration in the semiconductor layer often varies and causes the electron distribution on the surface inconstant. The area having higher electron density holds a stronger attraction to the metal ions in the electrolyte and speeds up the deposition thereof on the bond pad. Consequently, in the same period, the area having a higher doping concentration is deposited with a thicker plating layer; the area having a lower doping concentration is deposited with a thinner plating layer. In addition, the varying doping concentration in a single area also affects the deposition of the metal ions and brings about a varying thickness of one plating layer or even a vacancy. In the embodiment, the insulating layer formed on the p-type semiconductor layer degrades the electrons' attraction to the metal ions and roughly unifies the deposition speed of the metal ions on different areas, which results in an uniform thickness of the plating layer.

In the embodiment, the insulating layer is not limited to be formed on the side of p-type semiconductor layer. In the case that an epitaxial layer structure of the light-emitting diode is reversed, the insulating layer is formed on the side of n-type semiconductor layer as well. Furthermore, the insulating layer 25a covers the whole or only a portion of the surface of the pre-covering layer 25.

The Second Embodiment

Another embodiment of present invention is illustrated by manufacturing a horizontal type light-emitting diode. The so-called "horizontal type light-emitting diode" herein means a structure having a p-bond pad and an n-bond pad located on the same side of a substrate. The composition of the light-emitting diode includes but not limited to II-VI group compound, III-V group compound, group III-Nitride compound, and the combination thereof. The technology to form the horizontal type light-emitting diode by the aforementioned composition is known to the person skilled in the art and not explained in further detail.

Figure 4A:
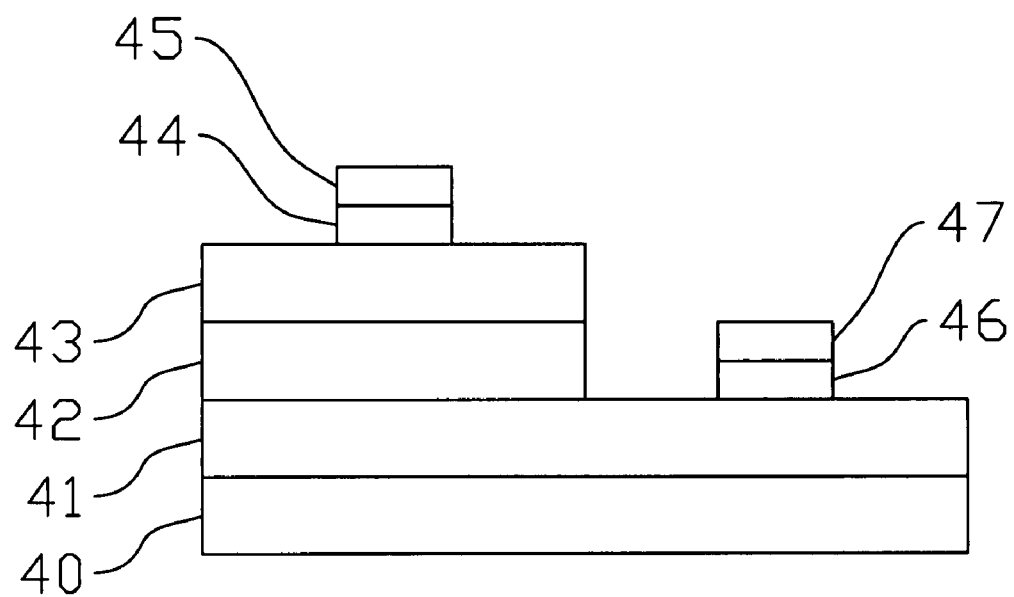
FIGS. 4A~4D illustrates cross sections of the manufacture of the semiconductor light-emitting device according to another embodiment of the present invention.

FIG. 4A illustrates a cross section of an epitaxial structure of a horizontal type light-emitting diode. The structure is completed before the formation of the bond pad, and includes at least a substrate 40, an n-type semiconductor layer 41, a light-emitting layer 42, and a p-type semiconductor layer 43. The material of the substrate 40 includes but not limited to sapphire, CVD diamond, ceramic, composite material, glass, and any material suitable to use in the structure of the horizontal type light-emitting diode. A pre-covering layer 45 is formed on the p-type semiconductor layer 43 to serve as a seed layer. A conductive layer 44 is optionally formed between the p-type semiconductor layer 43 and the pre-covering layer 45. A pre-covering layer 47 is formed on the n-type semiconductor layer 41 to serve as a seed layer. A conductive layer 46 is optionally formed between the n-type semiconductor layer 41 and the pre-covering layer 47. In addition, transparent conductive layers (not shown) are optionally formed between the conductive layer 44 and the p-type semiconductor 43, and between the conductive layer 46 and the n-type semiconductor layer 41, to serve as current spreading layers or window layers.

The material of the conductive layer 44 and 46 includes but not limited to Cr, Pt, Ni, Ge, and any material capable to form a preferable ohmic contact with the semiconductor layer. The thickness of layer 24 and 46 is respectively about 100 Å~1000 Å. The material of the pre-covering layer 45 and 47 includes but not limited to Au, Cu, Ni, and any material capable to serve as a seed layer in an electroless plating process. The thickness of layer 45 and 47 is about 100 Å~5000 Å. The material of the transparent conductive layers includes but not limited to ITO, CTO, IZO, AZO, ZnO, and transparent conductive metal layer such as Ni/Au. Each of the conductive layer 44, the conductive layer 46, the pre-covering layer 45, the pre-covering layer 47, and the transparent conductive layers is formed by one of chemical vapor deposition, physical vapor deposition, and sputtering.

Figure 4B:
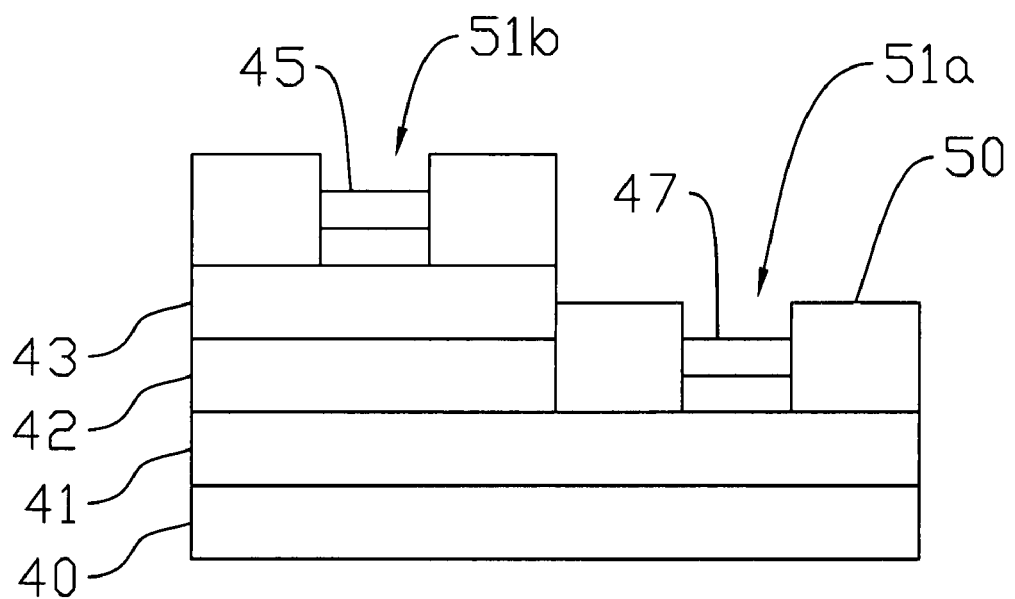

Referring to FIG. 4B, an insulating layer 50 is formed on the p-type semiconductor layer 43 and the n-type semiconductor layer 41 to isolate them from the electrolyte. Openings 51a and 51b are then formed on the insulating layer 50 to expose the pre-covering layers 45 and 47 by the known photolithography. The material of the insulating layer 50 includes but not limited to photoresist, $SiO_2$, $SiN_x$, and dry film. The thickness of layer 50 is about 100 Å~17 μm. The available photoresists can be referred to products described in the first embodiment. In the case that the material of the insulating layer 50 is $SiO_2$, DNRL300 is optionally covered on layer 50.

Figure 4C:
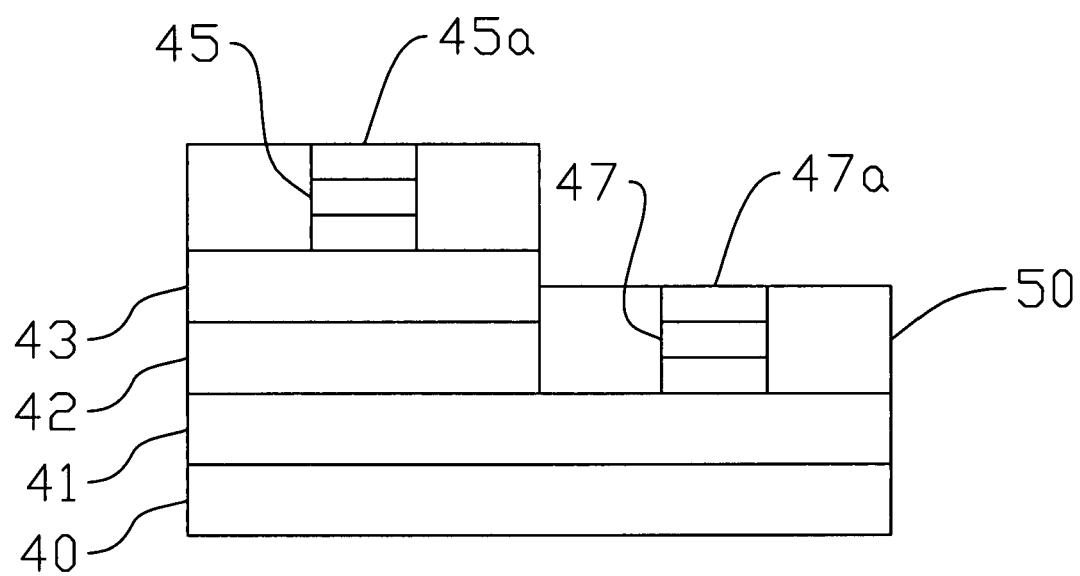

FIG. 4C illustrates the formation of the pre-covering layer 45 and 47 respectively on the plating layer 45a and 47a. The type of the electrolyte depends on the desired plating layer and is as described in the first embodiment.

Figure 4D:
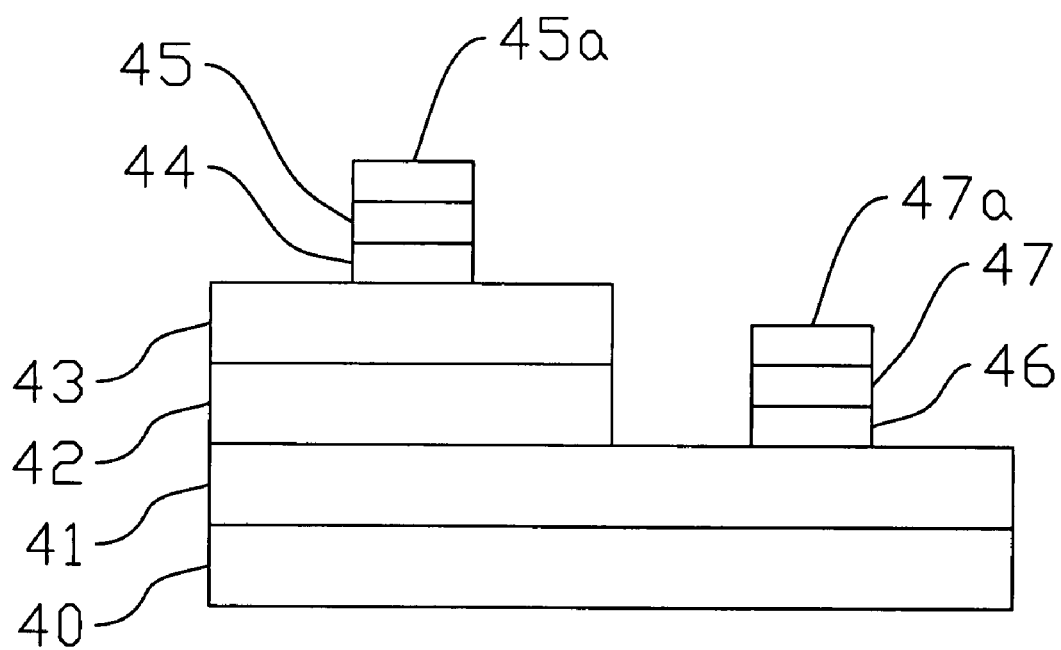

Referring further to FIG. 4D, after forming the plating layer 45a and 47a, the insulating layer 50 is removed, and the epitaxial structure of the wafer is diced into separated chips.

Figure 5:
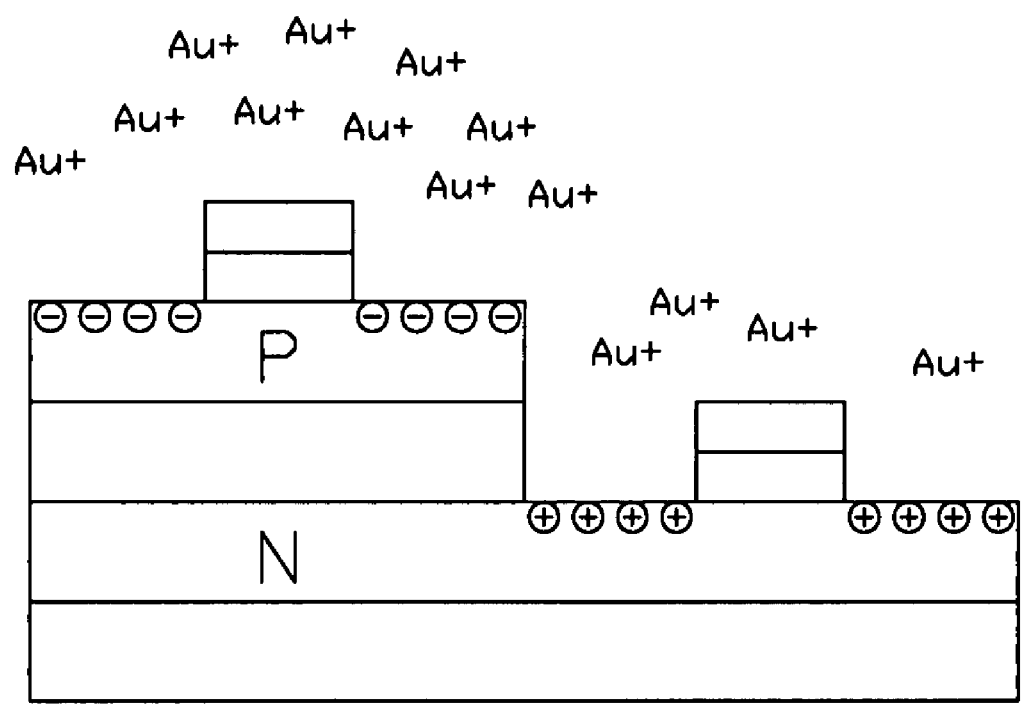
FIG. 5 illustrates Au ion distribution influenced by the semiconductor light-emitting device of FIG. 4A immersed in the electrolyte.

Referring to FIG. 5, the n-type and p-type semiconductor layers are on the same side of the substrate. The holes of the n-type semiconductor layer and the electrons of the p-type semiconductor layer tend to repel and attract the metal ions of the electrolyte respectively, which results in that the deposition rate of the metal ions on the p-type bond pad is greater than that on the n-type bond pad, and accordingly the plating layer of the p-type bond pad is thicker than that of the n-type bond pad. Furthermore, as described in the first embodiment, the varying impurity concentration potentially brings about the varying thickness of the plating layer on each of the bond pads. In the method of the present embodiment, by forming the insulating layers on the n-type and the p-type semiconductor layers, the attraction and/or the repellence of the metal ions caused by the electrons and holes is degraded, and the metal ions deposit on different areas at almost an equal rate, and therefore the plating layer reaches an uniform thickness.

In the embodiment, the plating layer 45a and 47a respectively covers the whole or only a portion of the surface of the pre-covering layer 45 and 47.

The impurity concentration of the plating layer in aforementioned embodiments can be measured by Auger electron microprobe, scanning electron microscope, or low energy electron diffraction. In general, the detecting level of Auger electron microprobe reaches to few monolayers.

The foregoing description has been directed to the specific embodiments of this invention. It will be apparent; however, that other variations and modifications may be made to the embodiments without escaping the spirit and scope of the invention.

What is claimed is:

1. A method of manufacturing a light-emitting structure, comprising:
providing a substrate;
forming a semiconductor multilayer on the substrate, the semiconductor multilayer comprising a p-type semiconductor layer, an n-type semiconductor layer, and a light-emitting region between the p-type semiconductor layer and the n-type semiconductor layer, wherein the p-type semiconductor layer or the n-type semiconductor layer has a varying impurity concentration therein;
forming a pre-covering layer on only a portion of the p-type semiconductor layer and the n-type semiconductor layer;
forming an insulating layer on the p-type semiconductor layer and the n-type semiconductor layer and exposing a part of the pre-covering layer; and
electroless plating an electrode layer by immersing the exposed pre-covering layer into an electrolyte having metal ions which reduce and deposit the electrode layer on the exposed pre-covering layer;
wherein the pre-covering layer is a seed layer for electroless plating the electrode layer.

2. The method of claim 1, further comprising:
removing the insulating layer.

3. The method of claim 1, further comprising:
forming a conductive layer between the pre-covering layer and at least one of the p-type semiconductor layer and the n-type semiconductor layer.

4. The method of claim 1, further comprising:
forming a transparent conductive layer between the pre-covering layer and at least one of the p-type semiconductor layer and the n-type semiconductor layer.

5. The method of claim 1, wherein the insulating layer is formed on the same side of the p-type semiconductor layer and the n-type semiconductor layer.

6. The method of claim 1, further comprising:
separating the semiconductor multilayer to form at least one light-emitting diode chip.

7. The method of claim 1, further comprising:
forming a bond pad on a side opposite to the pre-covering layer.

8. The method of claim 1, wherein the electrolyte is selected from a group consisting of gold sodium sulfide, copper sulfate, and nickel sulfate.

9. The method of claim 1, wherein a material of the pre-covering layer is selected from a group consisting of gold, copper, and nickel.

10. The method of claim 1, wherein a material of the conductive layer is selected from a group consisting of chromium, platinum, nickel, and germanium.

11. The method of claim 1, wherein the pre-covering layer has a thickness between 100 Å~5000 Å.

12. The method of claim 1, wherein the insulating layer has a thickness between 100 Å~17 μm.

13. The method of claim 3, wherein the conductive layer has a thickness between 100 Å~1000 Å.

14. The method of claim 4, wherein a material of the transparent conductive layer is selected from a group consisting of ITO, CTO, IZO, AZO, and transparent conductive metal.

15. The method of manufacturing a light-emitting structure of claim 1, further comprising reducing and depositing the metal ions on the pre-covering layer of uniform thickness.

* * * * *

UNITED STATES PATENT AND TRADEMARK OFFICE
CERTIFICATE OF CORRECTION

PATENT NO. : 8,039,279 B2
APPLICATION NO. : 11/890493
DATED : October 18, 2011
INVENTOR(S) : Chuang et al.

Page 1 of 1

It is certified that error appears in the above-identified patent and that said Letters Patent is hereby corrected as shown below:

On the Title Page

Please insert the following:

Item --(30)   Foreign Application Priority Data

August 7, 2006   [TW].................95128980--

Signed and Sealed this
Sixth Day of March, 2012

David J. Kappos
*Director of the United States Patent and Trademark Office*